US010338739B1

(12) United States Patent
Peterson et al.

(10) Patent No.: US 10,338,739 B1
(45) Date of Patent: Jul. 2, 2019

(54) METHODS AND APPARATUS TO DETECT A PRESENCE OF A CONDUCTIVE OBJECT

(71) Applicant: Cypress Semiconductor Corporation, San Jose, CA (US)

(72) Inventors: Jonathan R Peterson, Everett, WA (US); Cole D. Wilson, Everett, WA (US); Thomas Fuller, Seattle, WA (US); Derek James Valleroy, Seattle, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/346,322

(22) Filed: Nov. 8, 2016

Related U.S. Application Data

(63) Continuation of application No. 13/341,857, filed on Dec. 30, 2011, now Pat. No. 9,501,168.

(60) Provisional application No. 61/522,083, filed on Aug. 10, 2011.

(51) Int. Cl.
G06F 3/041 (2006.01)
G06F 3/044 (2006.01)
H03K 17/96 (2006.01)
G01R 27/26 (2006.01)

(52) U.S. Cl.
CPC ............ *G06F 3/0418* (2013.01); *G06F 3/044* (2013.01); *G01R 27/2605* (2013.01); *H03K 17/962* (2013.01)

(58) Field of Classification Search
CPC .... G06F 3/044; H03K 17/962; G01R 27/2605
See application file for complete search history.

(56) References Cited

U.S. PATENT DOCUMENTS

| 6,477,686 | B1 | 11/2002 | Dewey et al. |
| 2006/0114240 | A1* | 6/2006 | Lin .................. G06F 3/044 345/173 |
| 2007/0063707 | A1 | 3/2007 | Berkel |
| 2007/0084989 | A1 | 4/2007 | Lange et al. |
| 2007/0205994 | A1 | 9/2007 | Ieperen |
| 2008/0012838 | A1 | 1/2008 | Rimon |
| 2009/0237361 | A1 | 9/2009 | Mosby et al. |
| 2009/0256824 | A1 | 10/2009 | Hainzl et al. |
| 2009/0284495 | A1 | 11/2009 | Geaghan et al. |
| 2009/0309851 | A1 | 12/2009 | Bernstein |
| 2010/0006350 | A1 | 1/2010 | Elias |

(Continued)

FOREIGN PATENT DOCUMENTS

| EP | 2187291 A1 | 5/2010 |
| JP | 1120304 | 7/1999 |
| KR | 1020080028852 | 4/2008 |
| WO | 2007082290 A2 | 7/2007 |
| WO | 2009139214 A1 | 11/2009 |

OTHER PUBLICATIONS

International Search Report for International Application No. PCT/US2011/068231 dated Oct. 25, 2012; 4 pages.

(Continued)

*Primary Examiner* — Son T Le
*Assistant Examiner* — Dustin R Dickinson

(57) ABSTRACT

A method and apparatus to determine a plurality of regions, each of the plurality of regions having a detected change in sensor value that meets or exceeds a threshold value, fit a three dimensional shape to the plurality of regions, and determine a position of an object.

12 Claims, 8 Drawing Sheets

(56) References Cited

U.S. PATENT DOCUMENTS

| | | | |
|---|---|---|---|
| 2010/0007618 A1 | 1/2010 | Park et al. | |
| 2010/0073301 A1 | 3/2010 | Yousefpor et al. | |
| 2010/0079405 A1 | 4/2010 | Bernstein | |
| 2010/0117961 A1 | 5/2010 | Westerman | |
| 2010/0117981 A1 | 5/2010 | Chen et al. | |
| 2010/0289754 A1* | 11/2010 | Sleeman | G06F 3/0416 345/173 |
| 2010/0295796 A1 | 11/2010 | Roberts et al. | |
| 2010/0302197 A1* | 12/2010 | Joguet | G06F 1/32 345/173 |
| 2010/0309171 A1 | 12/2010 | Hsieh et al. | |
| 2010/0321334 A1* | 12/2010 | Oda | G06F 3/044 345/174 |
| 2010/0328263 A1 | 12/2010 | Lin | |
| 2011/0012856 A1 | 1/2011 | Maxwell et al. | |
| 2011/0037724 A1* | 2/2011 | Paulsen | G06F 3/0416 345/174 |
| 2011/0057670 A1 | 3/2011 | Jordan | |
| 2011/0157069 A1* | 6/2011 | Zhuang | G06F 3/044 345/174 |
| 2011/0260998 A1* | 10/2011 | Ludwig | G06F 3/0414 345/173 |
| 2011/0291980 A1 | 12/2011 | Lin et al. | |
| 2011/0310040 A1 | 12/2011 | Ben-Shalom et al. | |
| 2012/0044204 A1 | 2/2012 | Hashimoto et al. | |
| 2012/0086647 A1 | 4/2012 | Birkler | |
| 2012/0098757 A1* | 4/2012 | Samadani | G06F 3/0414 345/173 |
| 2012/0223895 A1 | 9/2012 | Lu et al. | |

OTHER PUBLICATIONS

SIPO Office Action for Chinese Application No. 201180008480.0 dated May 6, 2015; 7 pages.

SIPO Office Action for Chinese Application No. 201180008480.0 dated Dec. 30, 2015; 2 pages.

USPTO Advisory Action for U.S. Appl. No. 13/341,857 dated Apr. 16, 2015; 2 pages.

USPTO Final Rejection for U.S. Appl. No. 13/341,857 dated Jan. 26, 2015; 13 pages.

USPTO Non-Final Rejection for U.S. Appl. No. 13/341,857 dated Jun. 17, 2015; 12 pages.

USPTO Non-Final Rejection for U.S. Appl. No. 13/341,857 dated Jul. 24, 2014; 12 pages.

USPTO Non-Final Rejection for U.S. Appl. No. 13/341,857 dated Nov. 24, 2015; 12 pages.

USPTO Notice of Allowance for U.S. Appl. No. 13/341,857 dated Mar. 7, 2016; 9 pages.

USPTO Notice of Allowance for U.S. Appl. No. 13/341,857 dated Jul. 25, 2016; 8 pages.

Written Opinion of the International Searching Authority for International Application No. PCT/US2011/068231 dated Oct. 25, 2012; 3 pages.

KIPO Office Action for Application No. 10-2014-7004728 dated Nov. 20, 2017; 5 pages.

KIPO Office Action for Application No. 10-2014-7004728 dated Aug. 22, 2018; 3 pages.

KIPO Office Action for Application No. 10-2014-7004728 dated May 14, 2018; 4 pages.

* cited by examiner

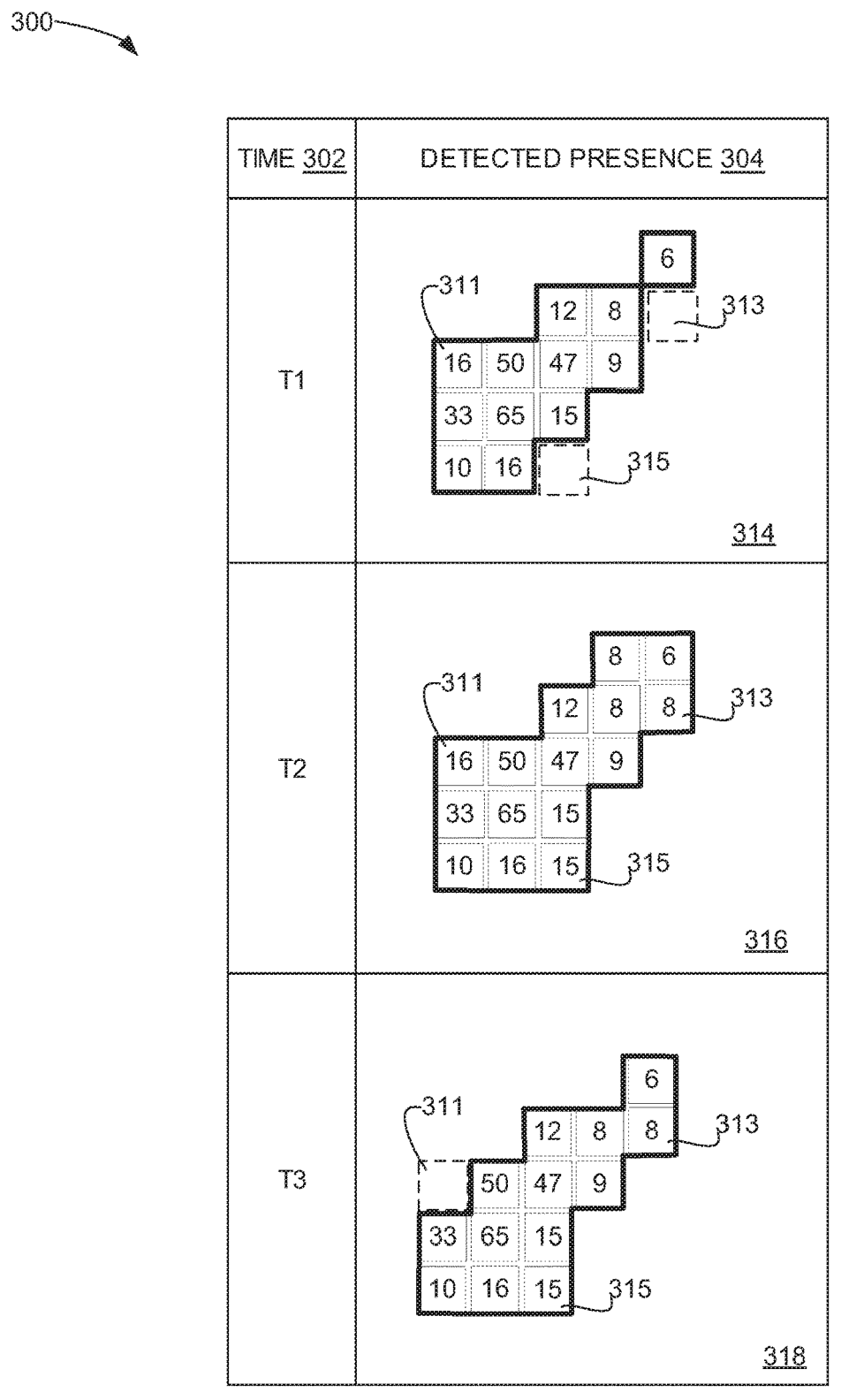

| TIME 302 | DETECTED PRESENCE 304 |
|---|---|
| T1 | 311, 313, 315 grid with values: 6; 12, 8; 16, 50, 47, 9; 33, 65, 15; 10, 16 — 314 |
| T2 | 311, 313, 315 grid with values: 8, 6; 12, 8, 8; 16, 50, 47, 9; 33, 65, 15; 10, 16, 15 — 316 |
| T3 | 311, 313, 315 grid with values: 6; 12, 8, 8; 50, 47, 9; 33, 65, 15; 10, 16, 15 — 318 |

*FIG. 3*

METHODS AND APPARATUS TO DETECT A PRESENCE OF A CONDUCTIVE OBJECT

CROSS-REFERENCE TO RELATED APPLICATION

This application is a Continuation of U.S. patent application Ser. No. 13/341,857, filed Dec. 30, 2011, which claims the benefit of U.S. Provisional Application No. 61/522,083, filed Aug. 10, 2011, all of which are incorporated by reference herein in their entirety.

TECHNICAL FIELD

The subject matter relates to the field of interpreting user input. More specifically, but not by way of limitation, the claimed subject matter discloses techniques for detecting a presence of a conductive object.

BACKGROUND

Computing devices, such as notebook computers, personal digital assistants, mobile communication devices, portable entertainment devices (e.g., handheld video game devices, multimedia players), and set-top-boxes (e.g., digital cable boxes, digital video disc (DVD) players) may include user interface devices that facilitate interaction between a user and the computing device.

One type of user interface device that has become more common operates by way of capacitance sensing. A capacitance sensing system may include a touchscreen, touch-sensor pad, a touch-sensor slider, or touch-sensor buttons, and may include an array of one or more capacitive sensor elements. Capacitive sensing typically involves measuring a change in capacitance associated with the capacitive sensor elements to determine a presence or position of a conductive object relative to the capacitive sensor elements. The conductive object may be, for example, a stylus or a user's finger.

The placement or movement of a conductive object relative to capacitive sensor elements as well as electrical noise of the capacitive sensor elements may affect accuracy and consistency in detecting a presence of a conductive object. When a detected presence is used to determine further information about a conductive object, such as the position of a conductive object, the placement and/or movement of the conductive object and electrical noise may also affect the accuracy and consistency of that further information.

BRIEF DESCRIPTION OF THE DRAWINGS

Some embodiments are illustrated by way of example and not limitation in the figures of the accompanying drawings in which:

FIG. 3 is a chart illustrating detected presences varying in shape and change in capacitance values, in accordance with an example embodiment;

DETAILED DESCRIPTION

Figure 1:
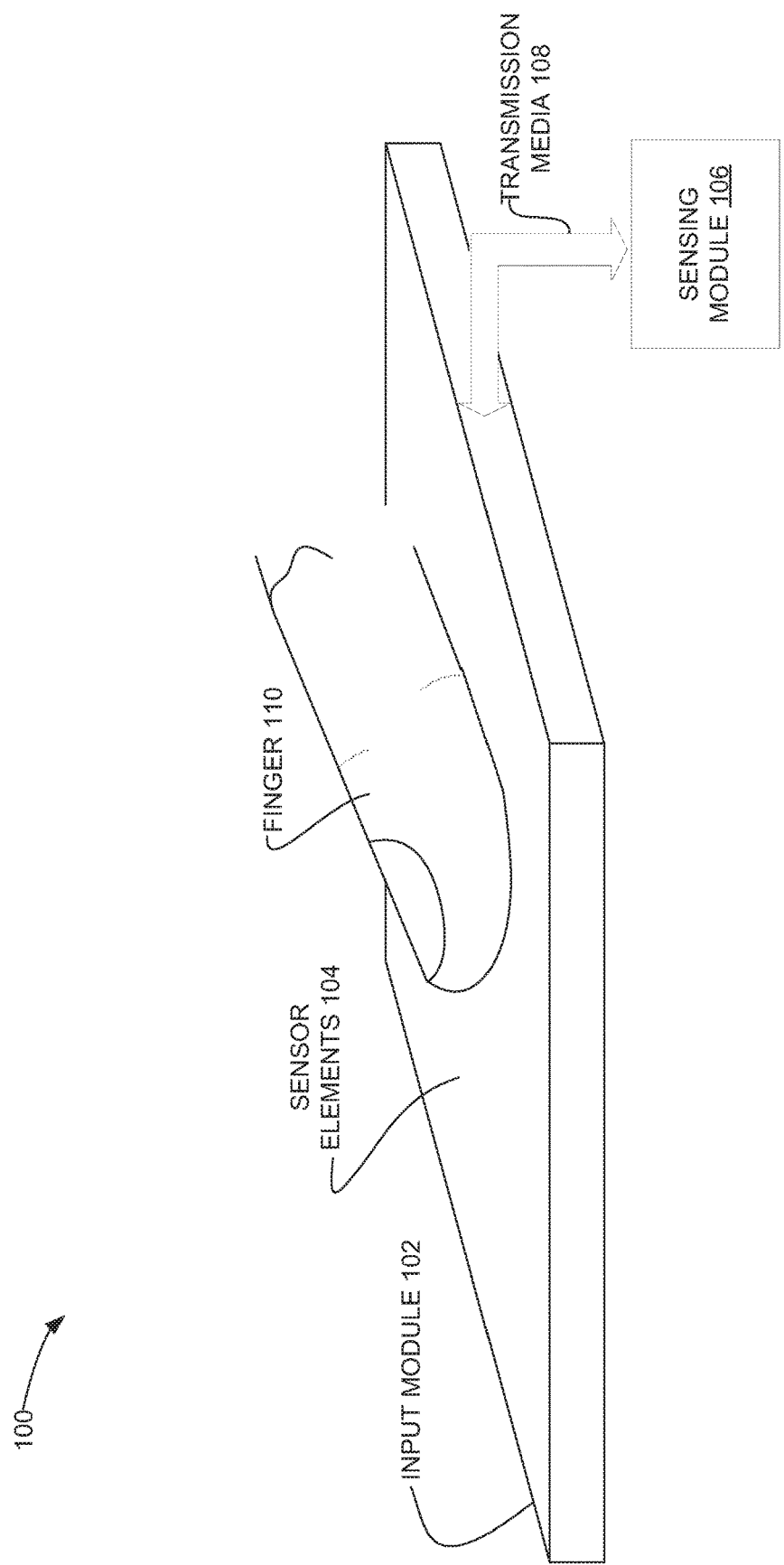
FIG. 1 is a block diagram illustrating an example sensing system, in accordance with various embodiments.

Methods and apparatus to detect a presence of a conductive object are discussed. In the following description, for purposes of explanation, numerous specific details are set forth in order to provide a thorough understanding of example embodiments. It will be evident, however, to one skilled in the art that the claimed subject matter may be practiced without these specific details.

The detailed description discloses examples of technology that, among other things, fits a geometric shape to a detected presence of an input and stabilizes the detected presence using the fitted shape. Some embodiments are now briefly introduced and then discussed in more detail along with other embodiments beginning with FIG. 1.

In an embodiment, a finger is used to provide input to a touchscreen that is organized into regions of capacitive sensor elements. Unintentional movements of the finger (e.g., trembling, vibrations, and rotation) as well as electrical noise may cause a calculated position of the finger to change even when the finger is intended to remain at the same position. Techniques described herein stabilize detected presences of a finger (e.g., or other conductive object) so that the calculated position of the finger is less affected by unintentional movements and electrical noise.

To this end, one embodiment includes determining a shape that fits a detected presence of a finger. The detected presence is represented through the regions on the touchscreen where changes in capacitance, which meets or exceed a threshold value, have been detected. The shape determined to fit the detected presence surrounds the regions where the changes in capacitance have been detected and also surrounds at least one region (e.g., or a portion of a region) where a change in capacitance has not been detected, which meets or exceeds the threshold value. Once the shape has been fit, a change in capacitance value can be assigned to this at least one region to stabilize detection of the finger. Subsequent detections of the same finger can be fit with the same or similar shape and be assigned the same or similar change in capacitance values, rather than allowing slight movements or noise to determine changes in capacitance.

In some embodiments, the stabilized detected presence can be used to calculate the intended position of the finger on the touchscreen. Alternatively or additionally, a stabilized detected presence can be used to identify a conductive object (e.g., identify the finger as an index finger), or to track the same finger across the touchscreen.

The detailed description below includes references to the accompanying drawings, which form a part of the detailed description. The drawings show illustrations in accordance with embodiments. These embodiments, which are also referred to herein as "examples," are described in enough detail to enable those skilled in the art to practice embodiments of the claimed subject matter. The embodiments may be combined, other embodiments may be utilized, or structural, logical, and electrical changes may be made without departing from the scope of what is claimed. The following detailed description is, therefore, not to be taken in a limiting sense, and the scope is defined by the appended claims and their equivalents.

FIG. 1 is a block diagram illustrating an example sensing system 100, in accordance with various embodiments. The sensing system 100 is shown to include an input module 102 coupled to a sensing module 106.

The input module 102 is to receive input from an input object (e.g., a finger 110). The input module 102 may include a touch pad, a touchscreen, or any other interface to receive input from an input object. In various embodiments, the sensing system 100 may provide the functionality of a touchscreen, a touchpad, a slider, a button, a switch, a level sensor, a proximity sensor, a displacement sensor, a combination thereof, or provide some other functionality based on a detection of a user input.

The input module 102 is shown to include sensor elements 104. In various example embodiments, the sensor elements 104 may include one or more of light sensitive elements, light emitting elements, photo-sensitive elements, pressure sensitive elements, and/or capacitive sensor elements. In some embodiments, the sensor elements are embedded into an image display of the input module 102. This is sometimes referred to as in-cell sensing. For example, a photosensitive element may be embedded into each display pixel of the image display. The photosensitive element senses light reflected by an input object back into the cell. As will be described with respect to FIG. 2, the sensor elements 104 may be organized into multiple regions of the input module 102.

A finger 110 is shown to be proximate to the input module 102 of FIG. 1 and is an example of an input object providing input to the input module 102. In various embodiments, the input object may be a non-conductive object, a conductive object (e.g., a finger or stylus) and/or may produce light or other energy (e.g., to be sensed through the sensor elements 104). The input object may be fixed in position or moveable in position relative to the input module 102. For example, a user may move the finger 110 relative to the input module 102. The user may include a human, a mechanism, a machine, and/or programmed instructions. Alternatively or additionally, the input module 102 may be allowed to move relative to a fixed or movable input object.

The sensing module 106 is to sense or detect a presence of one or more input objects proximate one or more of the sensor elements 104 of the input module 102. To this end, the sensing module 106 may perform scan operations to sense, through the sensing elements, signals reflecting pressure applied to the input module 102 through the input object, light (e.g., infrared light) associated with the input object, images of the input object, and/or capacitances of the sensor elements when the input object is present.

In an example scan operation, the sensing module 106 exchanges energy with the input module 102 through the transmission media 108. The transmission media 108 may include any medium through which the energy may be conveyed. For some embodiments, the transmission media 108 includes metal trace (e.g., copper wire) over which current can flow. Alternatively or additionally, the energy may be exchanged over a wireless transmission media. In one embodiment of a scan operation, the sensing module 106 applies a voltage to one or more of the sensor elements 104 through the transmission media 108 to form a capacitance. The sensing module 106 may alternatively or additionally detect a current or voltage resulting from a discharge of the one or more of the sensor elements 104.

In an embodiment, while the finger 110 is placed proximate to the input module 102, the sensing module 106 may detect the presence of the finger 110 multiple times through repeated scan operations. As will be discussed in more detail with respect to FIG. 3, the sensing module 106 may detect the presence of the same finger 110 multiple times, but the detected presences may have different characteristics from one another. In an embodiment, characteristics of a detected presence include changes in capacitance of the detected presence and the shape (e.g., the outline of the regions) of the detected presence.

As introduced above, the sensor elements 104 may be located or organized in different regions of the input module 102. A detected presence of the finger 110 over multiple regions of the input module 102 is discussed with respect to FIG. 2. As will also be described with respect to FIG. 2, once the sensing module 106 has detected a presence of the finger 110, the sensing module 106 may determine further information about the finger 110 based on characteristics of the detected presence. Examples of this further information about the finger 110 may include orientation of the finger 110, position of the finger 110 on the input module 102, and identification of the finger 110 (e.g., as an index finger).

Figure 2:
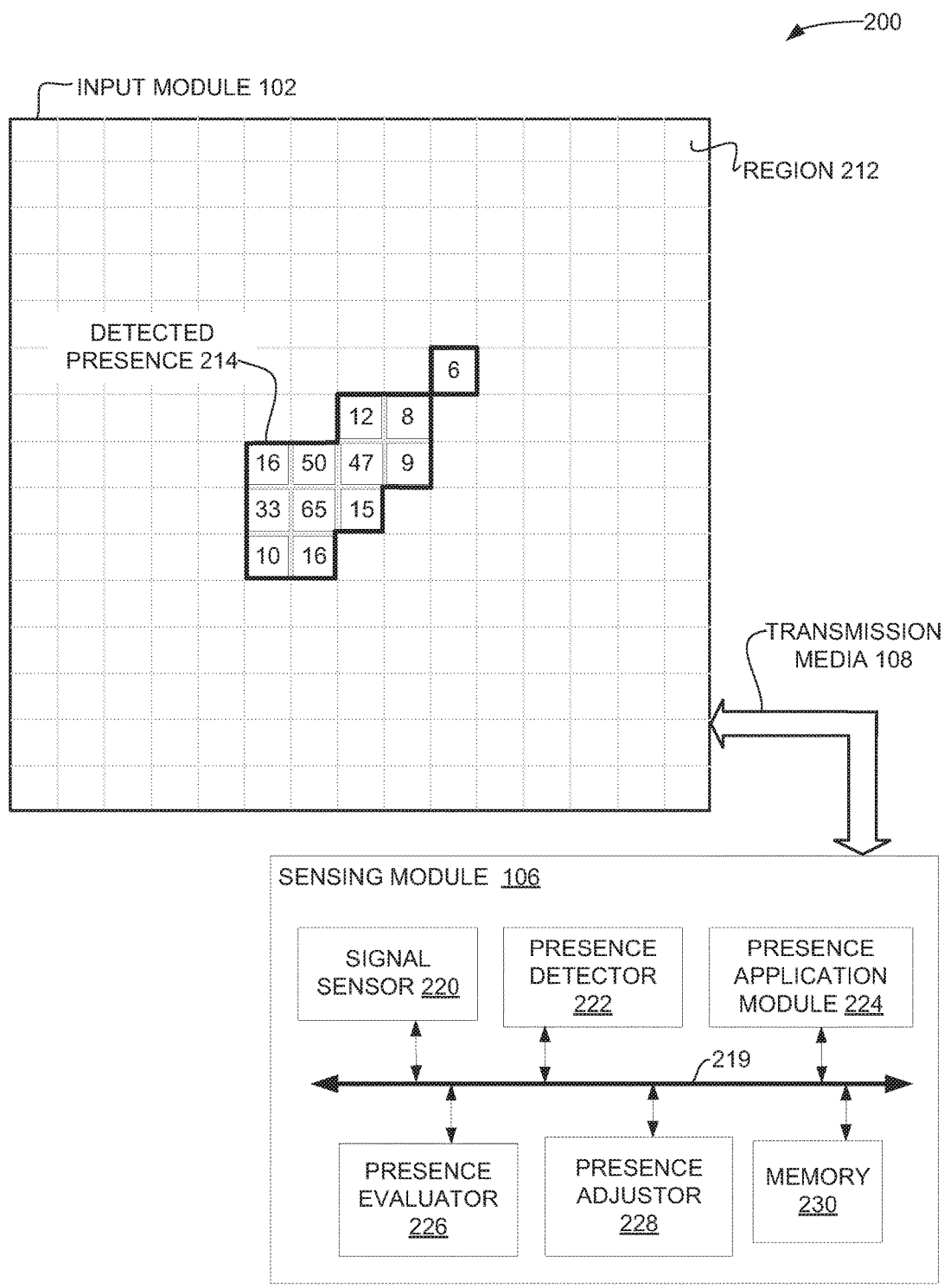
FIG. 2 is block diagram illustrating a detected presence, in accordance with an embodiment.

FIG. 2 is block diagram 200 illustrating a detected presence 214, in accordance with an embodiment. FIG. 2 is shown to include the input module 102 of FIG. 1 organized into a grid of regions. Each region is shown as a square, such as the region 212, and includes one or more capacitive sensor elements (not shown). It should be noted that in some embodiments, the size, shape, and organization of the input module 102 (e.g., regions) may be different from those shown in FIG. 2 without departing from the claimed subject matter.

The input module 102 is shown to include a detected presence 214, which is a representation of the finger 110 proximate to the input module 102. For example, the detected presence 214 may be thought of as a snapshot of the finger 110 taken by the sensing module 106. The detected presence 214 is shown as a number of neighboring regions of the input module 102, where each region of the detected presence 214 includes a numerical value. The numerical value represents a change in capacitance detected by the sensing module 106 that meets or exceeds a threshold value. Changes in capacitance that do not meet or exceed the threshold value are not included in the representation of the detected presence 214.

The sensing module 106 is shown to include a signal sensor 220, a presence detector 222, a presence application module 224, a presence evaluator 226, a presence adjuster 228, and a memory 230 coupled to one another through a bus 219, which each may be implemented using hardware, software, or a combination of hardware and software.

In an embodiment, signal sensor 220 is to communicate with the input module 102 over the transmission media 108 to detect capacitance of the sensor elements 104. For example, the signal sensor 220 may perform scan operations described above with respect to FIG. 1 to detect the capacitance. Alternatively or additionally, the signal sensor 220 may receive signals, responsive to the input object, reflecting pressure, light, and/or images of the input object. Signal sensing and presence detection are discussed below with respect to capacitive sensor elements for illustration and not limitation.

In an embodiment, the sensor elements within the regions of the detected presence 214 provide capacitance signals corresponding to an x-axis defined for the input module 102 and a y-axis defined for the input module 102. In an embodiment, the signal sensor 220 includes an analog-to-digital conversion circuit to convert analog capacitance signals to digital capacitance signals, which are used by the presence detector 222 to detect presence.

The presence detector 222 is to detect a presence of the finger 110 of FIG. 1 using signals (e.g., digital signals) received from the signal sensor 220. For example, the presence detector 222 may detect the presence of the finger 110 of FIG. 1 through comparing a capacitance value of a region of capacitive sensor elements when the finger 110 is not present (e.g., not proximate with a capacitive sensor element), with the capacitance value of the region of capacitive sensor elements when the finger 110 is present.

In an embodiment, the presence detector 222 determines changes in capacitance in different regions, represents each change in capacitance with a numerical value (e.g., as shown in the regions of the detected presence 214), and detects the presence of the finger 110 of FIG. 1 in the regions where the change in capacitance meets or exceeds the threshold value (e.g., a threshold change in capacitance value).

As introduced above with respect to FIG. 1, the presence detector 222 may detect the presence of the same finger 110 multiple times and the detected presences may have different characteristics from one another. Example characteristics of a detected presence may include the change in capacitance of its regions and the overall shape of the detected presence. For example, even when a user intends to keep the finger 110 of FIG. 1 in the same place on the input module 102, the presence detector 222 may represent consecutive detected presences (e.g., snapshots) of the same finger 110 with different shapes and different numerical values representing changes in capacitance (e.g., the same regions may have a different numerical value in consecutive detected presences).

FIG. 3 is a chart 300 illustrating detected presences 314, 316, and 318 varying in shape and change in capacitance values, in accordance with an example embodiment. The chart is shown to include a time column 302 and a detected presence column 304.

Referring to FIG. 1, a user may place the finger 110 proximate to the input module 102 to provide input to a specific location (e.g., to select an icon on a touchscreen) or simply to rest the finger 110 on the supportive surface of the input module 102. The presence detector 222 may then detect the presence of the finger 110 multiple times responsive to scan operations performed by the signal sensor 220 of FIG. 2.

Although the detected presences 314, 316, and 318 are associated with the same finger 110, they are shown to include variance in shape and variance in the numerical values representing change in capacitance of the regions. In an embodiment, the variance in characteristics is caused by electrical noise, movement of the finger 110 between scan operations, and/or a combination of the two. Movement of the finger 110 may include, for example and not limitation, unintentional trembling, vibration, and/or rotation of the finger 110.

At times T1, T2, and T3 of the time column 302, the presence detector 222 FIG. 2 represents the finger 110 of FIG. 1 as the detected presences 314, 316, and 318, respectively, of the detected presence column 304. At T1, the region 311 includes a numerical value (e.g., 16) and is part of the detected presence 314 but the regions 313 and 315 do not include a numerical value and are not part of the detected presence 314. At time T2, the region 311 includes the same numerical value but the regions 313 and 315 now include numerical values (e.g., 8 and 15, respectively) and are part of the detected presence 316. At T3, the region 311 does not include a numerical value and is not part of the detected presence 318. The variance observed in regions 311, 313, and 315 may be caused by electrical noise, movement of the finger 110, and/or a combination of the two. As a result, the presence detector of FIG. 2 detects variously shaped detected presence for the same finger 110.

Returning to FIG. 2, when output of the presence application nodule 224 is based on characteristics of detected presence that vary in different scan operations, inconsistent and/or inaccurate position calculation, finger identification, and finger tracking may result.

For example, once the presence detector 222 has detected the presence of the finger 110 of FIG. 1, the presence application module 224 may use the detected presence 214 (e.g., and its characteristics) to perform position calculations, finger identification, and/or finger tracking.

For example, the presence application module 224 may use characteristics of the detected presence 214 to identify a type of conductive object (e.g., an index finger tip) that is providing input to the input module 102. To this end, the presence application module 224 may compare a shape of the detected presence 214, with a shape stored in memory 230, of a particular type of conductive object (e.g., an index linger, a thumb, a stylus tip, or any other type of conductive object.)

Alternatively or additionally, the presence application module 224 may determine whether multiple detected presences (e.g., the detected presences 314, 316, and 318 of FIG. 3) are associated with one another based on their characteristics. For example, the presence application module 224 may track a finger as it moves in position across the input module 102 based on similarities in characteristics (e.g., in shape and change in capacitance) between detected presences.

Alternatively or additionally, the presence application module 224 may use characteristics of the detected presence 214 to calculate a position of the detected presence 214 relative to the input module 102. For example, the calculated position may be expressed as a point in an X-Y coordinate system defined for the input module 102 of FIG. 1. However, the position may be expressed with more or less than two-dimensions in other embodiments. In an embodiment, the presence application module 224 uses a centroid algorithm to determine the position.

The presence evaluator 226 and the presence adjuster 228 of FIG. 2 are to decrease or mitigate variance in detected presences (e.g., the detected presences 314, 316, and 318 of FIG. 3) of the same finger 110 of FIG. 1 in different scan operations. The operation of the presence evaluator 226 and the presence adjuster 228 are now discussed in more detail with respect to FIG. 4.

Figure 4:
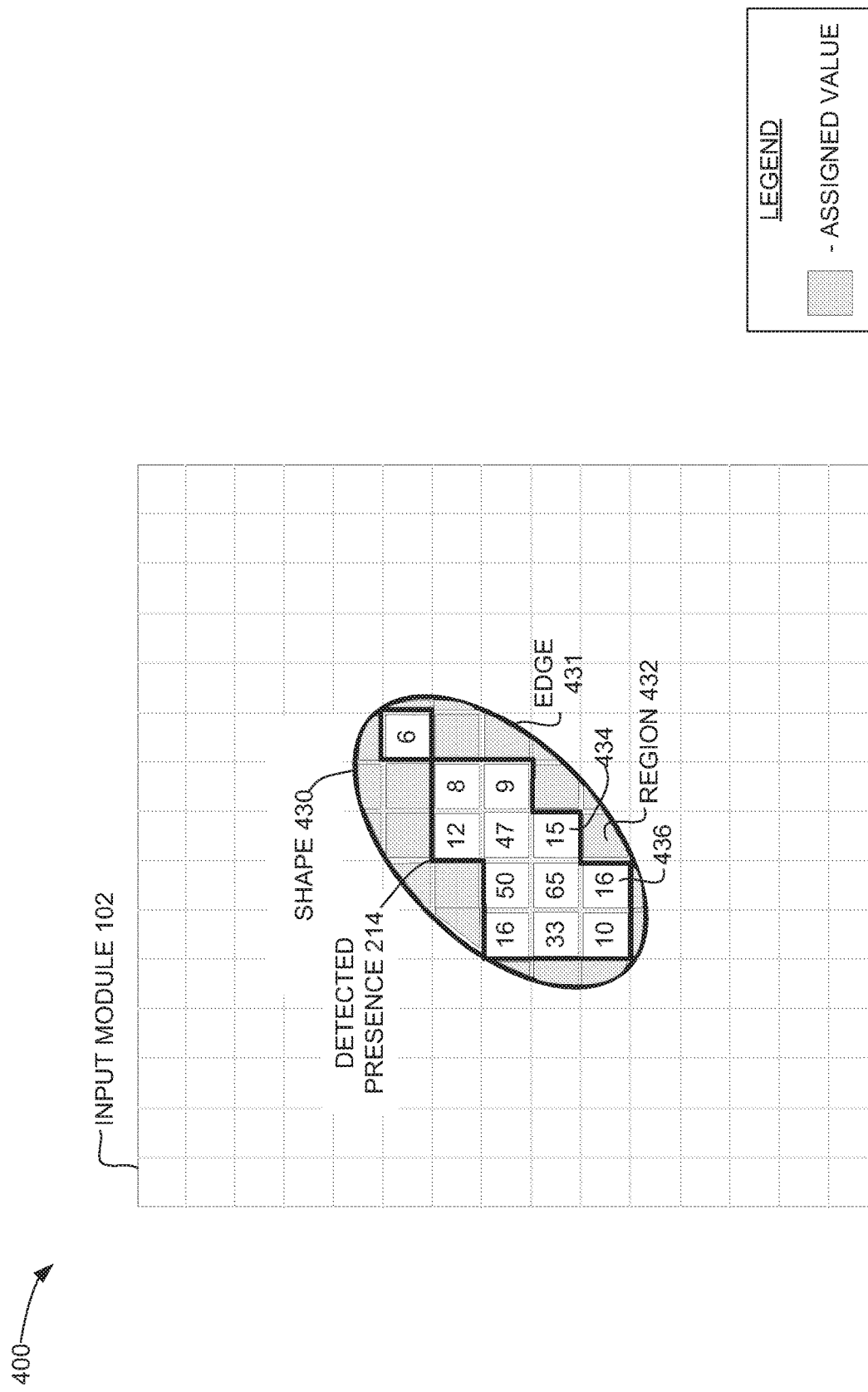
FIG. 4 is a block diagram illustrating a shape fit to a detected presence, in accordance with an embodiment.

FIG. 4 is a block diagram 400 illustrating a shape 430 fit to the detected presence 214, in accordance with an embodiment. FIG. 4 is shown to include the input module 102 including the detected presence 214 surrounded by the shape 430, which in this example is an ellipse. Within the shape 430 are shown regions having changes in capacitance that are above the threshold value (e.g., indicated with numerical values) and regions where any change in capacitance is not above the threshold value (e.g., regions of the shape 430 without numerical values).

The presence evaluator 226 of FIG. 2 is to determine regions of the input module 102 that may be affected by electrical noise and movement of the conductive object when the presence of the finger 110 of FIG. 1 is detected. To this end, in an embodiment, the presence evaluator 226 fits the shape 430 (e.g., a two-dimensional shape) to the detected presence 214. Regions within the outline of the shape 430 can be predicted to be affected by electrical noise and movement of the conductive object.

In an embodiment, the presence evaluator 226 selects an appropriately fit shape out of multiple shapes stored in memory 230. Shapes stored in the memory 230 may include ellipses, rectangles, circles, triangles, other standard shapes, combinations of shapes, and/or any other shape. In an embodiment, the selected shape is the shape that surrounds the detected presence 214 while surrounding the minimum number of regions without a change in capacitance above the threshold. For each shape tested for an appropriate fit, the presence evaluator 226 determines a number of regions without the change in capacitance above the threshold value. Each shape may be fit at several different angles of rotation. The presence evaluator 226 selects one of the multiple shapes with the minimum number of regions under the threshold value as a most appropriate fit. In an example embodiment, an appropriate fit is referred to as a "best fit."

The presence adjuster 228 may adjust or assign change in capacitance values of any regions within the shape 430. In some embodiments, the presence adjuster 228 may assign values based on the change in capacitance values of neighboring regions.

An assigned value may be an average of neighboring regions. In an embodiment, the presence adjuster 228 assigns the numerical value of 10.33 to the region 432, where 10.33 is the average of numerical values of neighboring regions 434 and 436 (e.g., 15 and 16, respectively) and the numerical value (e.g., zero) of the region 432 at the edge 431 of the shape 430. In another embodiment, the presence adjuster 228 assigns a fraction of the average that is proportional to the fraction of the region 432 that is within the shape 430. For example, if ⅚ of the region 432 is within the shape 430 then the presence adjuster 228 would assign a numerical value of around 8.61.

Alternatively or additionally, portions of the numerical values of the regions of the detected presence 214 can be applied to those regions where any change in capacitance does not meet or exceed the threshold value. For example, a numerical value of five could be subtracted from the region 434 and added to the region 432. In this technique, an overall sum of changes in capacitance of the detected presence 214 can remain unchanged.

By assigning change in capacitance values to regions within the shape 430, variance in detected presence 214 can be stabilized. In an embodiment, the same or similar shape 430 and assigned change in capacitance may be applied to subsequently detected presences of the same finger 110. Doing so reduces variation in shape and change in capacitance of multiple detected presences. In another embodiment, each subsequent detected presence can be fit with its own shape and those detected presences may be associated with one another if their fitted shapes are determined to have a requisite level of similarity.

A shape fit to the detected presence 214 as described herein can be used to identify a conductive object, track a conductive object, or be used to make the position calculation more accurate when the centroid of the shape is used to calculate position. A technique for accurate position calculation is described with respect to FIG. 5.

Figure 5:
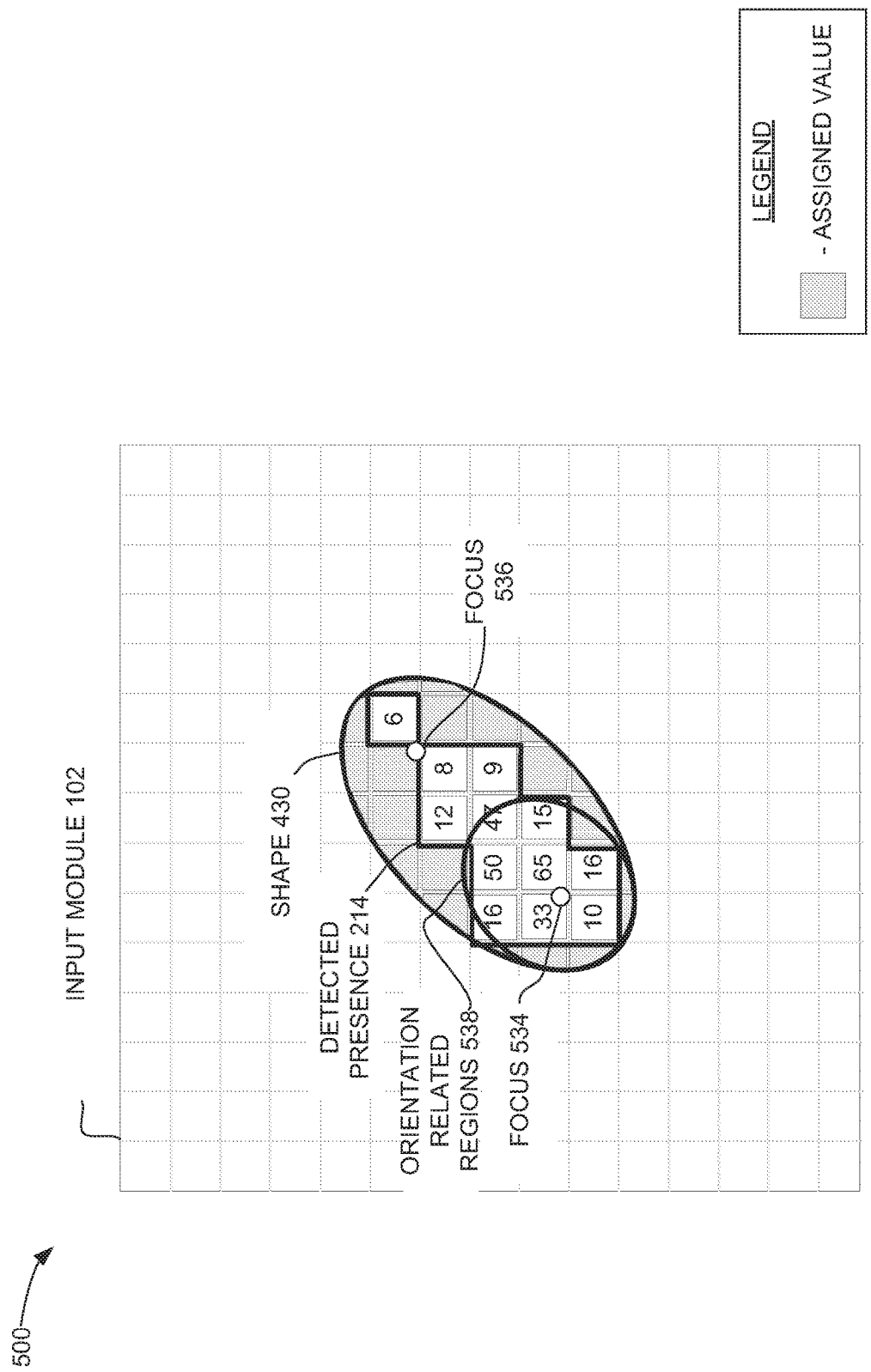
FIG. 5 is a block diagram illustrating geometric points of the shape used to determine an orientation of a detected presence, in accordance with an embodiment.

FIG. 5 is a block diagram 500 illustrating geometric points of the shape 430 used to determine an orientation of the detected presence 214, in accordance with an embodiment. In an embodiment, the presence evaluator 226 of FIG. 2 determines an orientation of the detected presence 214 based on the geometry of the shape 430. The orientation of the detected presence 214 can indicate the position where the touch is intended. For example, the orientation may indicate the direction that the conductive object points towards the input device. In an embodiment, a region or regions with the largest changes in capacitance of the detected presence 214 may indicate orientation.

FIG. 5 is shown to include the shape 430 (e.g., an ellipse), points of the shape 430 (e.g., foci 534 and 536 of the ellipse), and orientation related regions 538 of the shape 430. In an embodiment, the foci 534 and 536 of the ellipse are used to determine the orientation of the detected presence 214. The orientation related regions 538 may then be used to calculate a position of the detected presence 214.

For example, the presence evaluator 226 may compare changes in capacitance near the foci 534 and 536 of the ellipse. The presence evaluator 226 determines that the orientation is near the focus 534 where a peak change in capacitance is found. The peak change in capacitance may be peak numerical value of one region (e.g. 65) or a peak sum of numerical values of multiple regions. When another shape is fit to a detected presence (e.g., a square, a triangle, etc.,) geometric locations of the other shape may be used to determine orientation.

The presence adjuster 228 may then select a number of regions, e.g., the orientation related regions 538 surrounding the focus 534 which may be used by the presence application module 224 as the basis of a position calculation. In an embodiment, the presence application module 224 calculates the position of the detected presence 214 using only the change in capacitance values of the orientation related regions 538. Alternatively or additionally, the presence application module 224 may calculate the position using the orientation related regions 538 as well as other regions of the shape 430.

Figure 6:
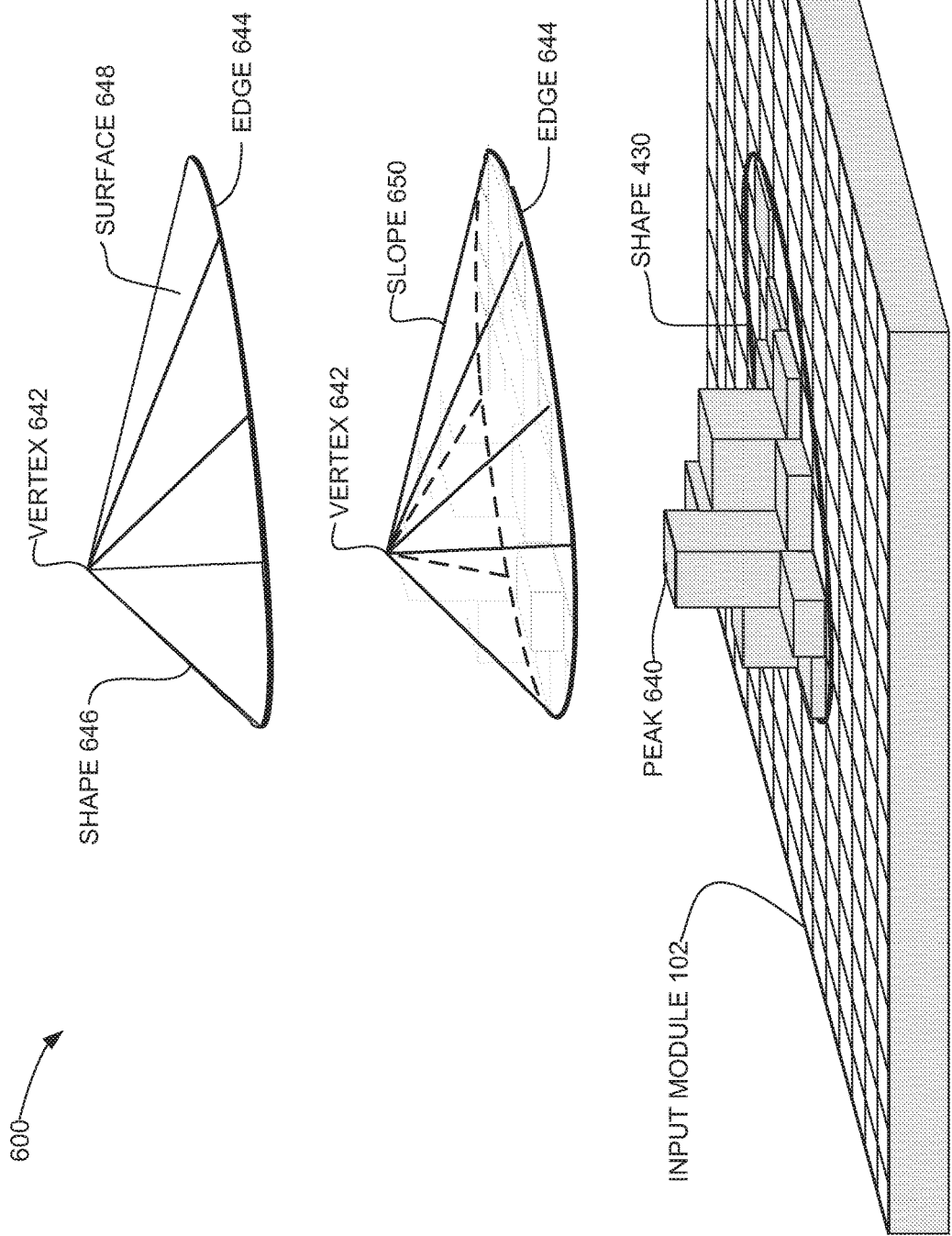
FIG. 6 is block diagram illustrating another shape fit to the detected presence, in accordance with an embodiment.

FIG. 6 is block diagram 600 illustrating another shape 646 fit to the detected presence 214, in accordance with an embodiment. A three-dimensional shape can be fit to the detected presence 214 to predict regions that may be affected by electrical noise and movement of the conductive object.

In an embodiment, the presence evaluator 226 generates the shape 646 which is three-dimensional and has a vertex 642 above the region with a peak 640 change in capacitance (e.g., 65 in FIG. 4). The vertex 642 is located at a height in the z-direction that is equal to the peak change in capacitance. The surface 648 of the shape 646 extends between the vertex 642 and edge 644 of the shape 430 (e.g., a two-dimensional base shape).

The presence adjuster 228 may use the shape 646 to modify change in capacitance values of the regions under the shape 646. The modification may mitigate the effects of variation in detected presence of the same finger 110.

For example, the presence adjuster 228 may assign changes in capacitance to a region such that the change in capacitance of the region follows the surface 648 of the shape 646. In embodiment, the presence adjuster 228 determines a target change in capacitance of a region based on a surface equation that defines the surface 648 of the shape 646. Alternatively or additionally, the presence adjuster 228 can modify a change in capacitance of a region to meet a slope 650 in the z-direction of the shape 646. In an embodiment, the slope 650 is defined by rise over run, where the rise is a difference between a peak change in capacitance and another change in capacitance within the shape 646, and the run is a horizontal difference between the region of the peak change in capacitance and the region of the other change in capacitance.

Regions that do not have change in capacitance values meeting the threshold value may be assigned change in capacitance values that meet the surface 648 of the shape 646 (e.g., and meet the threshold change in capacitance value). In an embodiment, regions that already have change in capacitance values over the threshold level may be modified to meet the surface 648 of the shape 646.

Fitting a three-dimensional shape and assigning or modifying change in capacitance values as described herein mitigates the effect of variation in detected presence of the same input object the finger 110 of FIG. 1).

Figure 7:
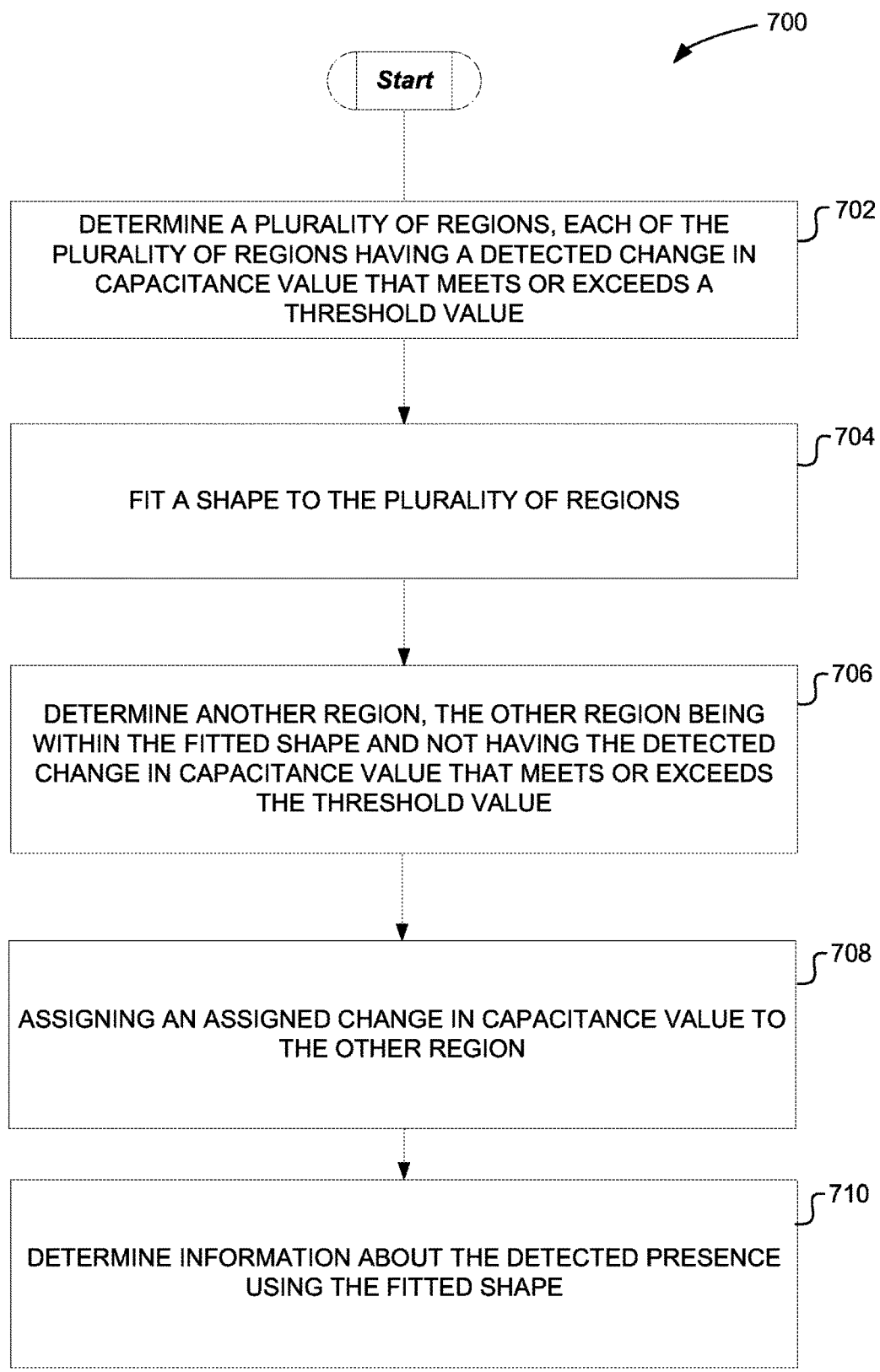
FIG. 7 is a flow diagram illustrating a method for detecting a presence of an conductive object, in accordance with an embodiment.

FIG. 7 is a flow diagram illustrating a method 700 for detecting a presence of a conductive object, in accordance with an embodiment. A description of the method 700 refers to components of drawings referred to above for the purpose of explanation and not to limit the claimed subject matter. It will be noted that the methods described herein may be performed by hardware, software, or a combination of hardware and software.

At block 702, the method 700 includes determining a plurality of regions, each of the plurality of regions having a detected change in capacitance value that meets or exceeds a threshold value. At block 704, the method 700 includes fitting a shape to the plurality of regions.

Referring to FIG. 4, the plurality of regions may include the regions of the detected presence 214. In an embodiment, the presence evaluator 226 of FIG. 2 fits the shape 430 of FIG. 4 to the detected presence 214. The presence evaluator 226 may iterate through several shapes stored in the memory 230 of FIG. 2 before selecting the shape (e.g., the shape 430 or the shape 646) that fits the detected presence 214 most appropriately (e.g., a selected fit).

At block 706, the method 700 includes determining another region, the other region being within the fitted shape and not having the detected change in capacitance value that meets or exceeds the threshold value. Referring to FIGS. 2 and 4, in an embodiment, the presence evaluator 226 may determine the region 432, which is within the fitted shape but does not have the detected change in capacitance that meets or exceeds the threshold value.

At block 708, the method 700 includes assigning an assigned change in capacitance value to the other region. In an embodiment, the presence adjuster 228 assigns an assigned change in capacitance value to the region 432 of FIG. 4 and/or to other shaded regions of the shape 430 of FIG. 4.

When the shape is a two-dimensional shape such as the shape 430 of FIG. 4, the presence adjuster 228 may calculate the assigned change in capacitance value using a detected change in capacitance of the regions 434 and 436, which neighbor the region 432. When the shape is a three-dimensional shape such as the shape 646 of FIG. 6, the presence adjuster 228 of FIG. 2 may calculate the assigned change in capacitance value using an equation of the surface 648 of the shape 646.

At block 710, the method 700 includes determining information about the detected presence using the fitted shape. Once the shape 430 of FIG. 4 or 646 of FIG. 6 has been fit, the presence evaluator 226 may determine an orientation of the finger 110 of FIG. 1 whose presence was detected (e.g., through the detected presence 214). In an embodiment, the orientation indicates where on the input module 102 the finger 110 is intended to provide input. For example, the presence evaluator 226 may determine that the finger 110 of FIG. 1 is oriented relative to a first geometric point (e.g., the focus 534) of the shape 430 (e.g., an ellipse) when the presence evaluator 226 determines that a number of regions surrounding the first geometric point (e.g., the orientation related regions 538) have a larger sum of changes in capacitance than a smaller sum of changes in capacitance of a same number of other regions surrounding a second geometric point (e.g., the focus 536) of the shape 430 (e.g., the ellipse).

Information about the detected presence 214 may also include position information. For example, the presence application module 224 of FIG. 2 may calculate a centroid of the shape 430 using the regions within the detected presence 214 and the regions including assigned values (e.g., the region 432 of FIG. 4). The calculated centroid can be used to determine an x-y position of the touch. Referring again to FIG. 5, the presence application module 224 of FIG. 2 may calculate a centroid of the orientation related regions 538.

Information about the detected presence 214 may also include identification information. For example, the presence application module 224 of FIG. 2 is identify a type of conductive object that caused the detected changes in capacitance through an association, in the memory 230 of FIG. 2, of the shape 430 with the type of conductive object (e.g., an index finger).

Figure 8:
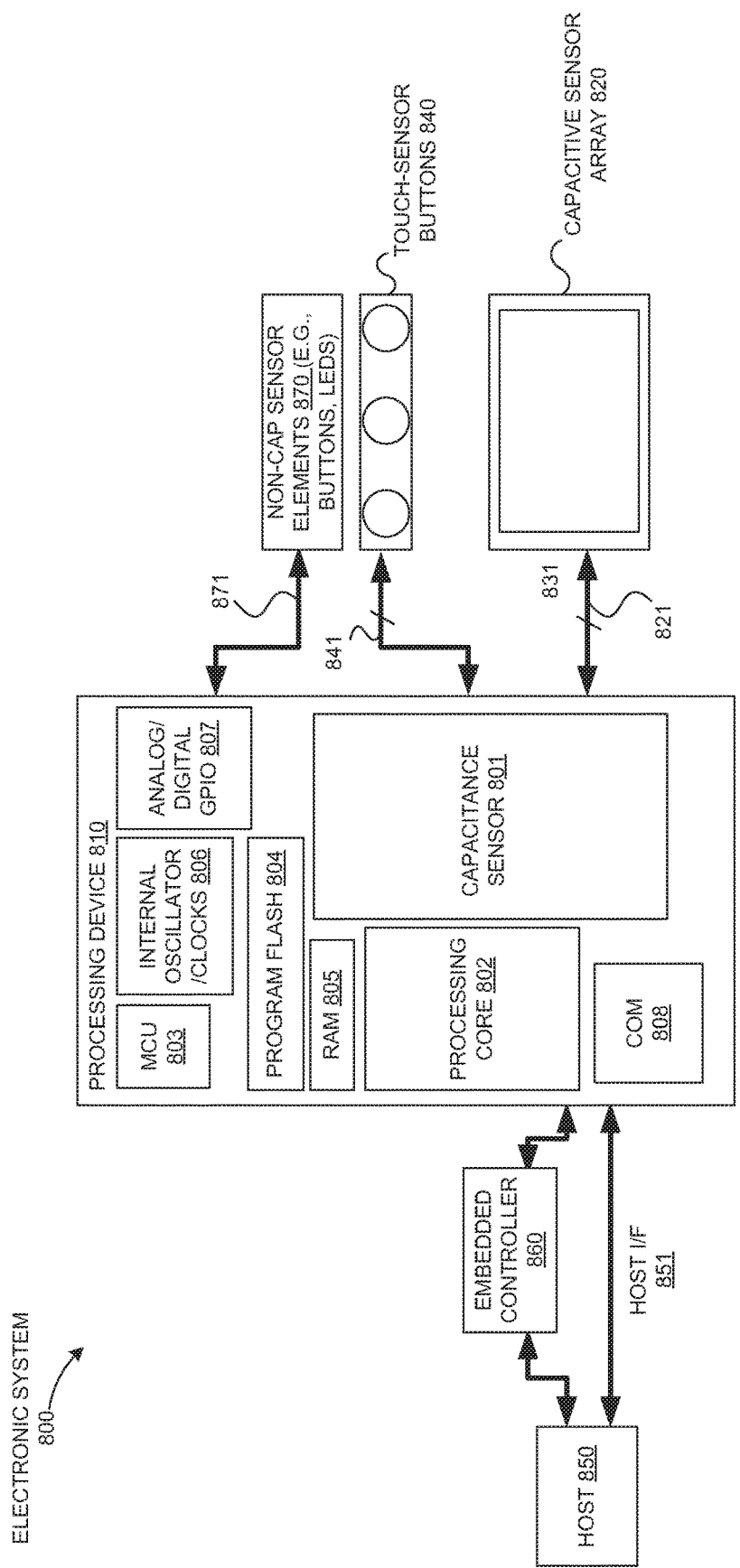
FIG. 8 is a block diagram illustrating an electronic system to detect a presence of a conductive object on a capacitive sensor array, in accordance with various embodiments.

FIG. 8 is a block diagram illustrating an electronic system 800 to detect a presence of a conductive object on a capacitive sensor array 820, in accordance with various embodiments.

The electronic system 800 includes a processing device 810, the capacitive sensor array 820, touch-sensor buttons 840, host processor 850, embedded controller 860, and non-capacitance sensor elements 870. The processing device 810 may include analog and/or digital general purpose input/output ("GPIO") ports 807. GPIO ports 807 may be programmable. The digital block array may be configured to implement a variety of digital logic circuits (e.g., DACs, digital filters, or digital control systems) using, in one embodiment, configurable user modules ("UMs"). The digital block array may be coupled to a system bus. Processing device 810 may also include memory, such as random access memory ("RAM") 805 and program flash 804. RAM 805 may be static RAM ("SRAM"), and program flash 804 may be a non-volatile storage, which may be used to store firmware (e.g., control algorithms executable by processing core 802 to implement operations described herein). The memory may include instructions that when executed perform the method described herein. Processing device 810 may also include a microcontroller unit ("MCU") 803 coupled to memory and the processing core 802.

As illustrated, capacitance sensor 801 may be integrated into processing device 810. Capacitance sensor 801 may include analog I/O for coupling to an external component, such as capacitive sensor array 820, touch-sensor buttons 840, and/or other devices. Capacitance sensor 801 and processing device 810 are described in more detail below.

The embodiments described herein can be used in any capacitive sensor array application, for example, the capacitive sensor array 820 may be a touch screen, a touch-sensor slider, or touch-sensor buttons 840 (e.g., capacitance sensor buttons). The operations described herein may include, but not be limited to, notebook pointer operations, lighting control (dimmer), volume control, graphic equalizer control, speed control, or other control operations requiring gradual or discrete adjustments. It will also be noted that these embodiments of capacitive sense implementations may be used in conjunction with non-capacitive sensor elements 870, including but not limited to pick buttons, sliders (ex. display brightness and contrast), scroll-wheels, multi-media control (ex. volume, track advance, etc) handwriting recognition and numeric keypad operation.

In one embodiment, the electronic system 800 includes a capacitive sensor array 820 of sensor elements coupled to the processing device 810 via bus 821. In an embodiment, the capacitive sensor array may include sensor elements 104 of FIG. 1. The capacitive sensor array 820 of the sensor elements may include a one-dimensional sensor array in one embodiment and a two dimensional sensor array in another embodiment. Alternatively or additionally, the capacitive sensor array 820 of the sensor elements may have more dimensions. The capacitive sensor array 820 may employ projected capacitive technology in which the capacitive sensor elements of the capacitive sensor array are formed in one or more capacitive sensor layers upon a substrate (not shown) of the capacitive sensor array 820. For example, the capacitive sensor elements may be patterned over an image display (e.g., a liquid crystal display) in one or more layers of transparent conducting film deposited on a glass substrate. A protective transparent layer (e.g., glass or plastic film) may cover the capacitive sensor elements to shield them from environmental damage.

Also, in one embodiment, the capacitive sensor array 820 of the sensor elements may be sliders, touchpads, touch screens or other sensing devices. In another embodiment, the electronic system 800 includes touch-sensor buttons 840 coupled to the processing device 810 via bus 841. Touch-sensor buttons 840 may include a single-dimension or multi-dimension sensor array. The single- or multi-dimension sensor array, may include multiple sensor elements. For a touch-sensor button, the sensor elements may be coupled together to detect a presence of a conductive object over the entire surface of the sense device. Alternatively, the touch-sensor buttons 840 may have a single sensor element to detect the presence of the conductive object. In one embodiment, touch-sensor buttons 840 may include a capacitive sensor element. Capacitive sensor elements may be used as non-contact sensor elements. These sensor elements, when protected by an insulating layer, offer resistance to severe environments.

The electronic system 800 may include any combination of one or more of the capacitive sensor array 820, and/or touch-sensor button 840. In another embodiment, the electronic system 800 may also include non-capacitance sensor elements 870 coupled to the processing device 810 via bus 8711. The non-capacitance sensor elements 870 may include buttons, light emitting diodes ("LEDs"), and other user interface devices, such as a mouse, a keyboard, or other functional keys that do not require capacitance sensing. In one embodiment, busses 871, 841, 831, and 821 may be a single bus. Alternatively, these buses may be configured into any combination of one or more separate buses.

Processing device 810 may include internal oscillator/clocks 806 and communication block ("COM") 808. The oscillator/clocks block 806 provides clock signals to one or more of the components of processing device 810. Communication block 808 may be used to communicate with an external component, such as a host processor 850, via host interface ("I/F") line 851. Alternatively, processing device 810 may also be coupled to the embedded controller 860 to communicate with the external components, such as host processor 850. In one embodiment, the processing device 810 is configured to communicate with the embedded controller 860 or the host processor 850 to send and/or receive data.

Processing device 810 may reside on a common carrier substrate such as, for example, an integrated circuit ("IC") die substrate, a multi-chip module substrate, or the like. Alternatively, the components of processing device 810 may be one or more separate integrated circuits and/or discrete components. In one exemplary embodiment, processing device 810 may be the Programmable System on a Chip ("PSoC®") processing device, developed by Cypress Semiconductor Corporation, San Jose, Calif. Alternatively, processing device 810 may be one or more other processing devices known by those of ordinary skill in the art, such as a microprocessor or central processing unit, a controller, special-purpose processor, digital signal processor ("DSP"), an application specific integrated circuit ("ASIC"), a field programmable gate array ("FPGA"), or the like.

It will also be noted that the embodiments described herein are not limited to having a configuration of a processing device coupled to the host processor 850, but may include a system that measures the capacitance on the sense device and sends the raw data to another host computer where it is analyzed by an application. In effect, the processing that is done by processing device 810 may also be done in the host computer.

It is noted that the processing device 810 of FIG. 8 may measure capacitance using various techniques, such as self-capacitance sensing and mutual capacitance sensing. The self-capacitance sensing mode is also called single-electrode sensing mode, as each sensor element needs only one connection wire to the sensing circuit. For the self-capacitance sensing mode, touching the sensor element increases the sensor capacitance as added by the finger touch capacitance is added to the sensor capacitance. The mutual capacitance change is detected in the mutual capacitance-sensing mode. Each sensor element uses at least two electrodes: one is a transmitter (TX) electrode (also referred to herein as transmitter electrode) and the other is a receiver (RX) electrode. When a finger touches a sensor element or is in close proximity to the sensor element, the capacitive coupling between the receiver and the transmitter of the sensor element is decreased as the finger shunts part of the electric field to ground (e.g., chassis or earth). In some embodiments, the processing device 810 may provide multi-touch capability through simultaneously detecting multiple conductive objects proximate to different regions of the capacitive sensor array 820. In an embodiment, the processing device 810 may include and/or provide the functionality of one or more of the sensing module 106 of FIG. 1 and/or the signal sensor 220, the presence detector 222, the presence application module 224, the presence evaluator 226, and the presence adjuster 228 as described above with respect to FIG. 2.

Capacitance sensor 801 may be integrated into the IC of the processing device 810, or alternatively, in a separate IC. The capacitance sensor 801 may include relaxation oscillator (RO) circuitry, a sigma delta modulator (also referred to as CSD) circuitry, charge transfer circuitry, charge accumulation circuitry, or the like, for measuring capacitance as would be appreciated by one of ordinary skill in the art having the benefit of this disclosure. Alternatively, descriptions of capacitance sensor 801 may be generated and compiled for incorporation into other integrated circuits. For example, behavioral level code describing capacitance sensor 801, or portions thereof, may be generated using a hardware descriptive language, such as VDHL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe capacitance sensor 801.

It will be noted that the components of the electronic system 800 may include only some or all the discrete components described above, or some combination thereof.

In one embodiment, electronic system 800 is used in a notebook computer. Alternatively, the electronic device may be used in other applications, such as a mobile handset, a personal data assistant ("PDA"), a keyboard, a television, a remote control, a monitor, a handheld multi-media device, a handheld video player, a handheld gaming device, or a control panel.

Methods and apparatus to detect a presence of a conductive object have been described. Although the claimed subject matter has been described with reference to specific embodiments, it will be evident that various modifications and changes may be made to these embodiments without departing from the broader spirit and scope of what is claimed. Accordingly, the specification and drawings are to be regarded in an illustrative rather than restrictive sense.

In this document, the terms "a" or "an" are used, as is common in patent documents, to include one or more than one. In this document, the term "or" is used to refer to a nonexclusive or, such that "A or B" includes "A but not B," "B but not A," and "A and B," unless otherwise indicated. In the event of inconsistent usages between this document and those documents so incorporated by reference, the usage in the incorporated reference(s) should be considered supplementary to that of this document; for irreconcilable inconsistencies, the usage in this document controls.

The above description is intended to be illustrative, and not restrictive. For example, the above-described embodiments (or one or more aspects thereof) may be used in combination with each other. Other embodiments will be apparent to those of skill in the art upon reviewing the above description. The scope of the claims should, therefore, be determined with reference to the appended claims, along with the full scope of equivalents to which such claims are entitled. In the appended claims, the terms "including" and "in which" are used as the plain-English equivalents of the respective terms "comprising" and "wherein." Also, in the following claims, the terms "including" and "comprising" are open-ended; a system, device, article, or process that includes elements in addition to those listed after such a term in a claim are still deemed to fall within the scope of that claim. Moreover, in the following claims, the terms "first," "second," and "third," etc. are used merely as labels and are not intended to impose numerical requirements on their objects.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims.

What is claimed is:

1. A method of stabilizing detected presence, comprising:
    responsive to a first scan operation by a capacitive sensor, detecting a first presence of a conductive object based on a first plurality of regions of a device interface having changes in sensor values that meet or exceed a threshold value;
    determining a three dimensional shape for the detected first presence, the three dimensional shape comprising the first plurality of regions of the device interface having the changes in sensor values that meet or exceed the threshold value and a second plurality of regions of the device interface not having changes in sensor values that meet the threshold value;
    using a processing device, calculating modified changes in sensor values for the second plurality of regions, based on a surface of the three dimensional shape, wherein the modified changes in sensor values meet the surface of the three dimensional shape;
    responsive to a second scan operation by the capacitive sensor, detecting a second presence of the conductive object based on a third plurality of regions of the device interface having changes in sensor values that meet or exceed the threshold value, wherein a difference between the changes in sensor values of the detected first presence and the detected second presence is caused by at least one of electrical noise and movement of the conductive object;
    using the processing device, assigning the three dimensional shape to the detected second presence; and
    calculating a coordinate position of the detected first presence and the detected second presence based on the three dimensional shape.

2. The method of claim 1, wherein the three dimensional shape has a vertex.

3. The method of claim 2, wherein the vertex is above a region with a maximum change in sensor value of the first plurality of regions.

4. The method of claim 1, wherein calculating the coordinate position is further based on a surface equation that defines a surface of the three dimensional shape.

5. The method of claim 1, wherein determining the three dimensional shape further includes selecting the three dimensional shape from a plurality of shapes.

6. A processing device comprising at least one memory including instructions stored thereon that when executed by at least one processor, causes the processing device to perform operations comprising:
    responsive to a first scan operation, detecting a first presence of a conductive object based on a first plurality of regions of a capacitive sensor array having changes in sensor values that meet or exceed a threshold value;
    determining a shape for the detected first presence, the shape comprising the first plurality of regions of the capacitive sensor array having the changes in sensor values that meet or exceed the threshold value and a second plurality of regions of the capacitive sensor array not having changes in sensor values that meet the threshold value;
    calculating a modified change in sensor value for at least one of the second plurality of regions, based on a change in capacitance value of neighboring region that neighbors the at least one of the second plurality of regions;
    responsive to a second scan operation, detecting a second presence of the conductive object based on a third plurality of regions of the capacitive sensor array having changes in sensor values that meet or exceed the threshold value, wherein a difference between the changes in sensor values of the detected first presence and the detected second presence is caused, at least in part, by movement of the conductive object;
    assigning the shape to the detected second presence; and
    calculating a same coordinate position for the detected first presence and the detected second presence based on the shape.

7. The processing device of claim 6, wherein determining the shape comprises determining that the shape is a best fit to the first plurality of regions, out of a plurality of shapes, stored in the memory.

8. The processing device of claim 6, wherein the shape comprises a three-dimensional shape including a vertex that is located at a maximum change in sensor value of the first plurality of regions.

9. An electronic system comprising:
   at least one memory;
   at least one processor; and
   a capacitive sensor configured to detect a first presence of a conductive object based on a first plurality of regions of a capacitive sensor array having changes in sensor values that meet or exceed a threshold value, responsive to a first scan operation, and detect a second presence of the conductive object based on a third plurality of regions of the capacitive sensor array having changes in sensor values that meet or exceed the threshold value, responsive to a second scan operation, wherein a difference between the changes in sensor values of the detected first presence and the detected second presence is caused, at least in part, by movement of the conductive object,
   wherein the at least one processor is configured to access the at least one memory to determine a shape for the detected first presence, the shape comprising the first plurality of regions of the capacitive sensor array having the changes in sensor values that meet or exceed the threshold value and a second plurality of regions of the capacitive sensor array not having changes in sensor values that meet the threshold value, calculate a modified change in sensor value for at least one of the second plurality of regions, based on a change in capacitance value of a neighboring region that neighbors the at least one of the second plurality of regions, and assign the shape to the detected second presence.

10. The electronic system of claim 9 wherein the at least one processor is configured to calculate a same coordinate position for the detected first presence and the detected second presence based on the shape.

11. The electronic system of claim 9, wherein determining the shape comprises determining that the shape is a best fit to the first plurality of regions, out of a plurality of shapes, stored in the memory.

12. The electronic system of claim 9, wherein the shape comprises a three-dimensional shape including a vertex that is located at a maximum change in sensor value of the first plurality of regions.

* * * * *